(12) United States Patent
Fujimoto et al.

(10) Patent No.: US 7,303,337 B2
(45) Date of Patent: Dec. 4, 2007

(54) OPTICAL COMMUNICATIONS MODULE

(75) Inventors: Takeshi Fujimoto, Osaka (JP); Yoshiki Kuhara, Osaka (JP); Hiromi Nakanishi, Osaka (JP); Keiichi Fukuda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 109 days.

(21) Appl. No.: 10/628,777

(22) Filed: Jul. 28, 2003

(65) Prior Publication Data

US 2005/0177319 A1    Aug. 11, 2005

(30) Foreign Application Priority Data

Sep. 18, 2002    (JP)    ............... 2002-271805

(51) Int. Cl.
    *G02B 6/36*    (2006.01)
    *G02B 6/00*    (2006.01)
(52) U.S. Cl. .......................................... 385/88; 385/92
(58) Field of Classification Search ............ 385/88–94
    See application file for complete search history.

(56) References Cited

U.S. PATENT DOCUMENTS

| | | | |
|---|---|---|---|
| 6,592,269 B1 * | 7/2003 | Brophy et al. ................ 385/92 |
| 6,729,771 B2 * | 5/2004 | Kim et al. ..................... 385/76 |
| 6,974,263 B2 * | 12/2005 | Sato et al. ..................... 385/88 |
| 2001/0024551 A1 * | 9/2001 | Yonemura et al. ............ 385/88 |
| 2002/0028048 A1 * | 3/2002 | Dair et al. ..................... 385/92 |
| 2002/0076173 A1 * | 6/2002 | Jiang et al. ................... 385/92 |
| 2002/0126456 A1 * | 9/2002 | Sato et al. ................... 361/728 |
| 2002/0141706 A1 * | 10/2002 | Nakura et al. ................ 385/53 |
| 2003/0142924 A1 * | 7/2003 | Ikeda et al. ................... 385/88 |
| 2003/0147601 A1 * | 8/2003 | Bartur et al. ................. 385/92 |

FOREIGN PATENT DOCUMENTS

| | | |
|---|---|---|
| JP | 6-350214 | 12/1994 |
| JP | 7-297518 | 11/1995 |
| JP | 11-345987 | 12/1999 |

* cited by examiner

*Primary Examiner*—Sung Pak
(74) *Attorney, Agent, or Firm*—Fish & Richardson P.C.

(57) ABSTRACT

In an optical communications module comprising one or more dielectric substrates equipped with an optical transmitter section, an optical receiver section or an optical transceiver section, and a chassis encasing all of them, a metal part is formed on one side of at least one of the dielectric substrates such that the metal part constitutes the whole or a part of the exterior surface of the chassis so that the length of heat conduction from a dielectric substrate with heat-generating components installed thereon can be minimized so as to efficiently release heat through the metal part to outside, curbing a temperature increase within the chassis. Thus, the optical communications module can exhibit excellent performance.

8 Claims, 5 Drawing Sheets

FIG. 5 ( a ) 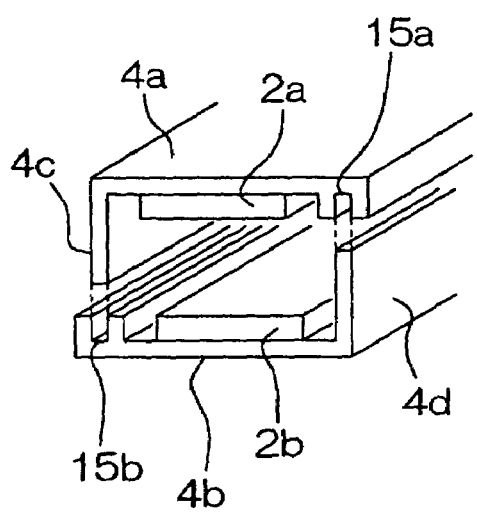
FIG. 5 ( b ) 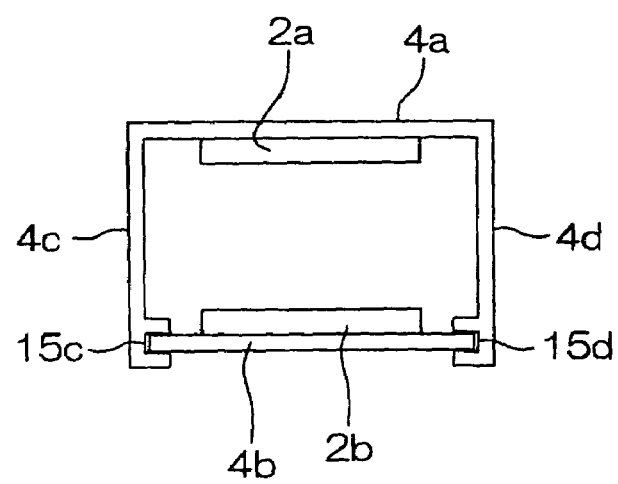

OPTICAL COMMUNICATIONS MODULE

BACKGROUND OF THE INVENTION

1. Field of the Invention

This invention relates to an optical communications module equipped with at least one optical transmitter section, one optical receiver section, or one optical transceiver section.

2. Description of the Background Art

An optical communications module is usually equipped with an optical transmitter section, an optical receiver section, or an optical transceiver section. The optical transmitter section includes a laser diode and an integrated circuit for operating the laser diode (a driver IC), while the optical receiver section incorporates an optical receiver device and an integrated circuit for amplifying electric signals (an amplifier IC).

Such optical transmitter or receiver section is usually mounted on a dielectric substrate, which is entirely covered by a chassis (Refer to Japanese Patent Application Publication No. 11-345987 for an example).

As the optical communication technology advances, there is a growing necessity to develop a smaller and less expensive optical communications module that is suited to mass production.

When the optical communications module is downsized, the optical power efficiency of the optical communications module tends to be degraded since the substrate and component parts are arranged more closely within the chassis, causing the temperature inside the chassis to increase by heat generated by the laser diode, the driver IC, and the amplifier IC. In addition, the receiving sensitivity of the optical receiver device and the amplifier IC also is adversely affected.

Due to such heat-associated problems, the downsizing of optical communications modules requires improvements in their heatsink efficiency.

SUMMARY OF THE INVENTION

An object of the present invention is to provide a downsized and inexpensive optical communications module without the aforementioned heat-associated problems.

An optical communications module according to this invention comprises one or more dielectric substrates on which an optical transmitter section, an optical receiver section, or an optical transceiver section is provided, and a chassis encasing all of the dielectric substrates (the chassis refers to the outermost member of framework of the optical communications module), wherein at least one dielectric substrate has a metal part formed on one side thereof, the metal part constituting at least the whole or a part of an outermost surface of the chassis.

This structure allows heat to escape from the dielectric substrate to the outside of the optical communications module through the metal part, which is formed on one side of the substrate and which constitutes the whole or part of the chassis. Thus, since the dielectric substrate provides outstanding heatsink efficiency, curbing a temperature increase within the chassis, excellent performance of the optical communications module can be achieved.

As used herein, "a metal part formed on one side of the dielectric substrate" refers to a part where a dielectric substrate and a metal plate are fixed together tightly so as to facilitate heat conduction. Such tight fixing can be attained for example by adhesive bonding, locking nuts and bolts, riveting, caulking, metal vapor deposition, plating, coating, laminating or sputtering.

The materials of the dielectric substrate include a resin such as polyimide, epoxy or polytetrafluoro-ethylene, and ceramics such as alumina. The metal plate can be produced for example from aluminum, copper, iron, gold, or silver.

A metal base substrate (a dielectric substrate laminated with a metal plate) may be employed as the dielectric substrate with the metal part formed on one side thereof. As the metal base substrate is obtained in the market, the optical communications module can be easily manufactured.

Thermally connecting a plurality of dielectric substrates to one another through the metal part of the chassis enables heat exchange through the metal part, which results in improvement of heatsink efficiency. "The metal part of the chassis" herein described refers to a metal part which is formed on one side of the dielectric substrate and which is a metal part of the chassis, regardless of constituting the whole or part of the outermost face of the chassis or other part of the chassis.

If a plurality of dielectric substrates are employed and thermally separated from one another, it is possible to prevent the occurrence of heat interference between the dielectric substrates.

In terms of heat release, it is more preferable that the chassis has one or more vents.

If a multilayer wiring substrate is employed as the dielectric substrate, it is possible to expose its grounding layer to the inside of the chassis. It is preferable that a metal plate be attached to the exposed surface of the grounding layer such that the metal plate is thermally in contact with the metal part of the chassis. This results in enhanced heatsink efficiency.

The grounding layer exposed to the inside of the chassis may have a heatsink installed thereon.

When it is necessary to lead out terminals of the optical transmitter section, optical receiver section, or optical transceiver section, or if component parts need to be controlled from outside of the module, the metal part formed on one side of the dielectric substrate can be partially removed to form an opening through which the terminals and component parts are exposed to outside.

According to this invention as described heretofore, since a dielectric substrate equipped with heat-generating components is designed to have a metal part formed on one side thereof, constituting the whole or a part of the chassis, the length of heat conduction can be minimized so that heat is efficiently released through the metal part to the outside of the optical communications module. Thus, it is possible to achieve excellent performance of the optical communications module by curbing a temperature increase that may occur within the chassis.

BRIEF DESCRIPTION OF THE DRAWINGS

FIG. 1(a) is an exploded view of an optical communications module according to the present invention, while

FIG. 4(a) is a sectional side view of the optical communications module, while FIG. 4(b) shows its perspective view.

FIG. 5(a) and FIG. 5(b) show a structure of the optical communications module in which a plurality of metal plates are integrated into a single piece by integral molding. FIG. 5(a) is a perspective view of the optical communications module, while FIG. 5(b) is its front view.

DETAILED DESCRIPTION OF THE INVENTION

Figure 1A:
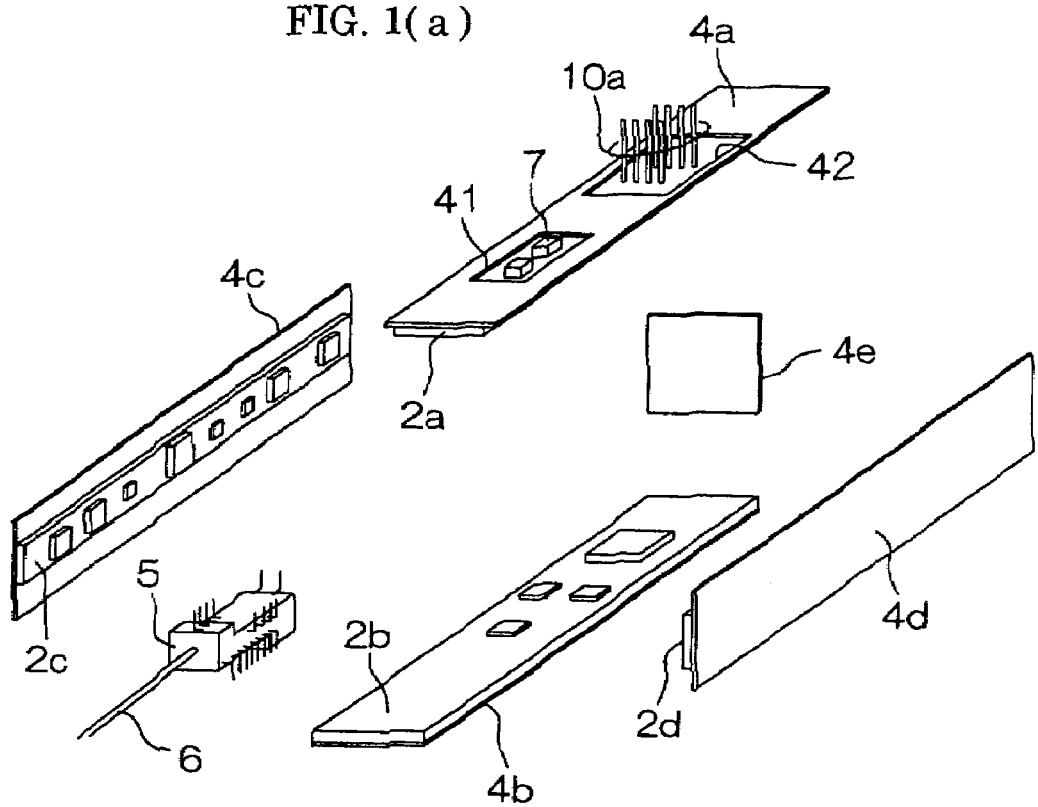

Hereinafter, embodiments of the present invention are described in detail with reference to the accompanying drawings. In the drawings, the same components are denoted by the same reference numerals, and redundant descriptions thereof are omitted. The proportions adopted in the drawings and in the descriptions are not necessarily equal to each other.

Figure 1B:
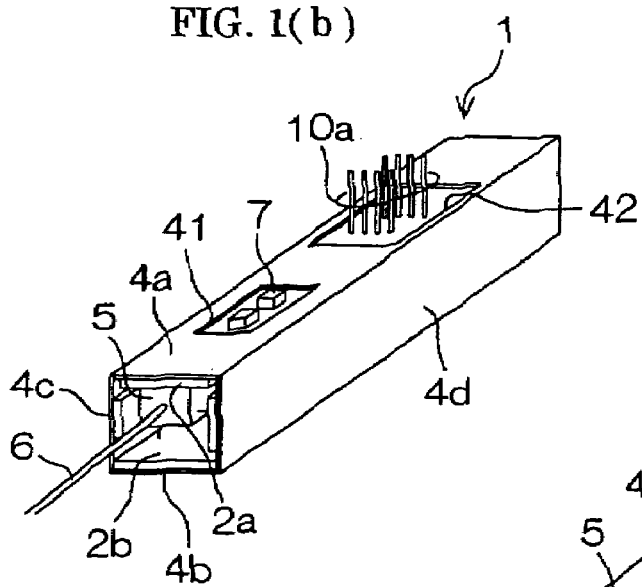
FIG. 1(b) is a perspective view of the optical communications module when assembled.

FIG. 1(a) is an exploded view of an optical communications module 1 according to the present invention. FIG. 1(b) is a perspective view of the assembled optical communications module 1.

The optical communications module 1 is structured such that a chassis 4, which consists of metal plates 4a, 4b, 4c, 4d, and 4e, encases therein a pair of dielectric substrates 2a and 2b which are arranged to face each other vertically and another pair of dielectric substrates 2c and 2d which face horizontally each other. The dielectric substrates 2a, 2b, 2c and 2d provide the photoelectric transfer function of transmitter and receiver signals, the electrical signal processing capability, optical signal processing capability, and electric/optical interface capability in connection with an external circuit (not shown in FIG. 1(a)) outside the optical communications module 1. The dielectric substrates 2a, 2b, 2c and 2d can be either single-layer wiring substrates, or multiple-layer wiring substrates having a plurality of wiring layers laminated therein (Note that multiple-layer wiring substrates are illustrated in FIG. 1(a)).

A module 5, which is a component for conversion of electric and optical signals, is positioned between the dielectric substrates 2a and 2b.

On the rear side of the individual dielectric substrates 2a, 2b, 2c and 2d, there are metal plates 4a, 4b, 4c and 4d formed respectively and attached firmly. In other words, the dielectric substrates 2a, 2b, 2c and 2d are substrates having metal plates 4a, 4b, 4c and 4d respectively formed on the rear side thereof, and the metal plates 4a, 4b, 4c and 4d in combination with a metal plate 4e functioning as a bottom plate constitute the chassis 4 of the optical communications module 1. These dielectric substrates consisting of resin substrates with metal plates on the rear side thereof are exemplified by metal base substrates (Refer to Japanese Patent Application Publications Nos. 6-350214 and 7-297518 for example).

The metal plates 4a, 4b, 4c, 4d, and 4e are first assembled and then fixed to one another through such methods as welding, soldering, pressuring, caulking, wrapping and binding a metal band around the plates, and adhesive bonding. Fixing the metal plates 4a, 4b, 4c, 4d and 4e together facilitates heat conductions therebetween. Another example of dose contact between the metal plates is illustrated in FIG. 5 and herein later.

Figure 1C:
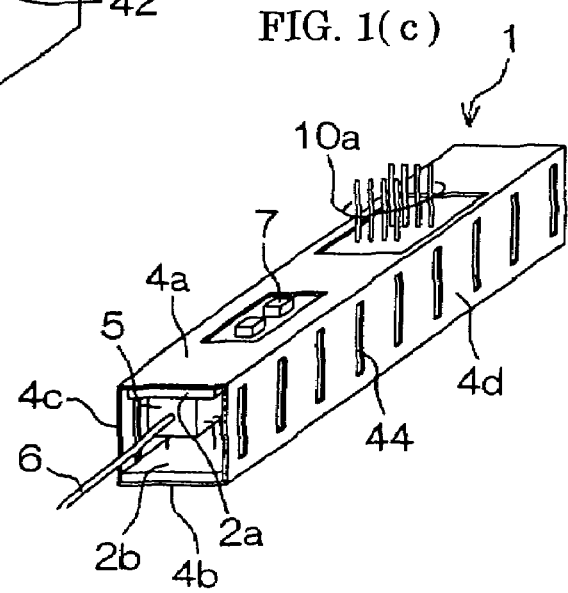
FIG. 1(c) illustrates an example having vents on a side face of the chassis.

FIG. 1(c) is a perspective view of the optical communications module 1 of the present invention, wherein vents 44 are provided in the metal plates 4c and 4d, without providing the dielectric substrates 2c and 2d on their inner surfaces. The vents 44 allow air to circulate in and out of the chassis 4, further improving the heatsink efficiency of the optical communications module 1.

Figure 2:
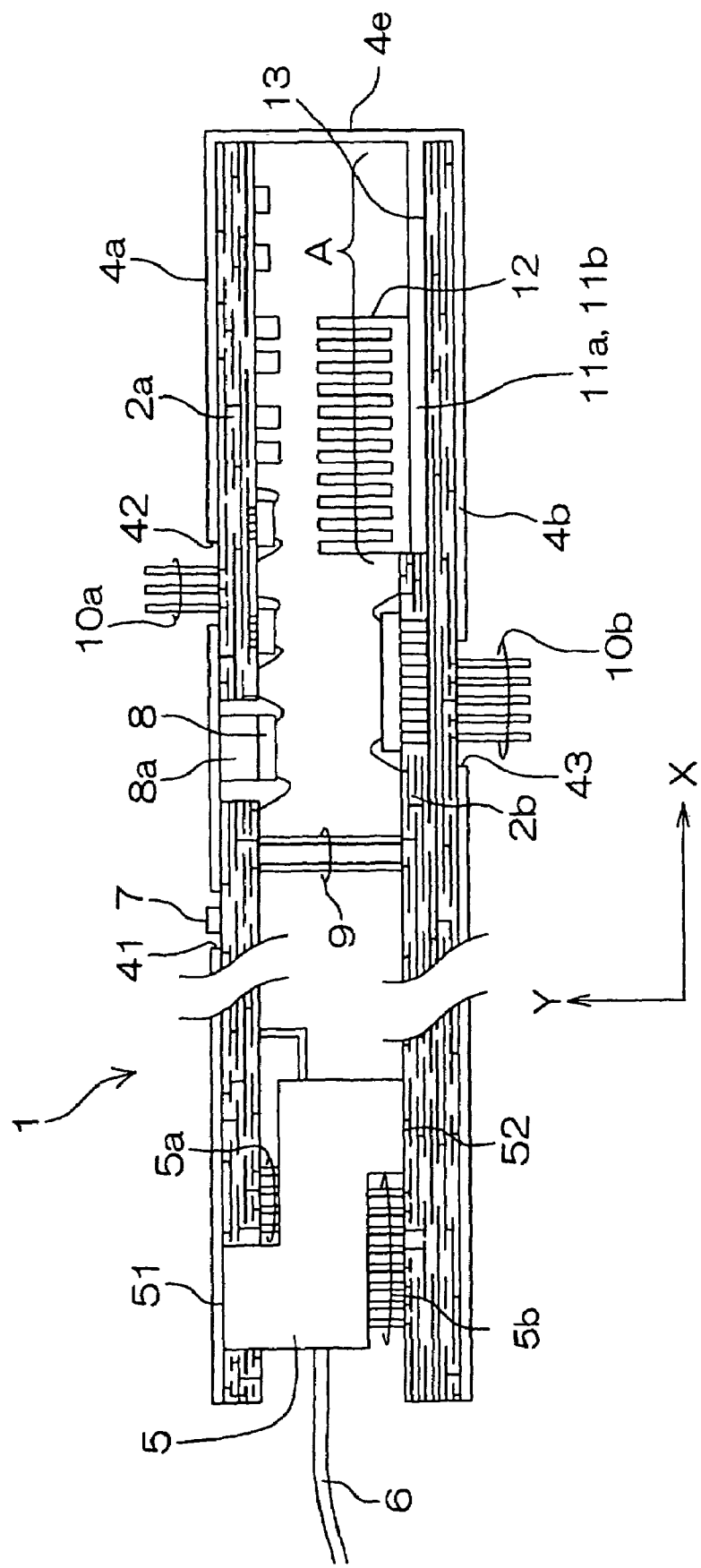
FIG. 2 shows a sectional side view of the optical communications module of the present invention.

FIG. 2 is a sectional side view of the optical communications module. A module 5, which is placed between the dielectric substrates 2a and 2b, is connected with an optical fiber 6 for optical connection with a network, on the front side where there is no connecting member between the dielectric substrates 2a and 2b, that is, at the front side (the side face viewed from X-direction in FIG. 2) of the optical communications module.

The module 5 has a lead frame equipped with electronic circuit parts such as an integrated circuit, a resistor and a capacitor; a light emitting device exemplified by a laser diode; an optical receiver device represented by a photodiode; an Si platform; and optical circuit parts such as an optical waveguide. The module 5 is formed with a resin by transfer molding such that terminals 5a and 5b of the lead frame protrude from the upper and bottom surfaces thereof outwardly (in ± directions indicated by Y in FIG. 2), respectively. The terminals 5a and 5b are soldered to electrodes of the dielectric substrates 2a and 2b, respectively.

Also, the top and bottom surface areas 51 and 52 of the module 5 are in contact with the metal plate 4a and the dielectric substrate 2b, respectively, so that heat generated inside the module 5 can dissipate efficiently.

The dielectric substrate 2a is equipped with various electronic parts, including adjustment electronic parts 7 such as a trimmer capacitor and a trimmer resistor, and integrated circuits parts 8 consuming a large amount of power. The adjustment electronic parts 7 are configured to protrude from the rear side of the dielectric substrate 2a through an opening 41 that has been fabricated on the metal plate 4a by etching, drilling or other processing methods. Integrated circuit parts 8 are fitted directly to the metal plate 4a through a metal block 8a for improved heatsink efficiency. The metal block 8 can be formed for example from copper, a copper-tungsten alloy, iron, silver and gold.

Wires 9 are employed for the connection of the dielectric substrates 2a and 2b. In addition, terminals 10a provided for input in, and output to, the external circuit (not shown in the figures) protrude from the rear side of the dielectric substrate 2a through an opening 42 formed in the metal plate 4a by etching, drilling or other processing methods. In the same manner, terminals 10b are configured to protrude from the rear side of the metal plate 4b through an opening 43 thereof.

Furthermore, in a section denoted by A in FIG. 2, a metal plate 11a or 11b is adhered to the grounding layer 13, which has been exposed upward (i.e., in the direction indicated by Y in FIG. 2), in the dielectric substrate 2b consisting of a multilayer wiring substrate.

Figure 3:
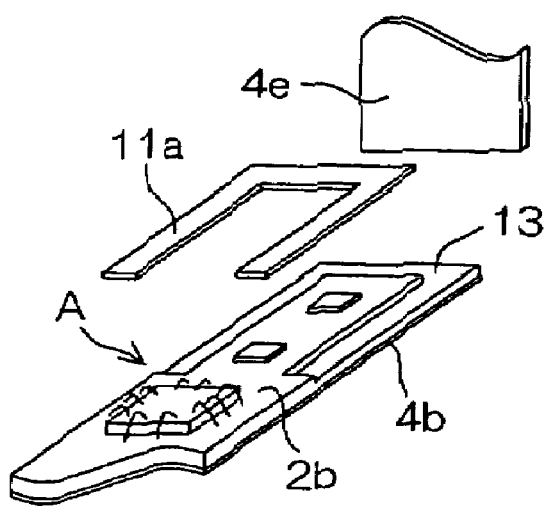
FIG. 3(a) and FIG. 3(b) are exploded views of a section indicated by A in FIG. 2.
Figure 3:
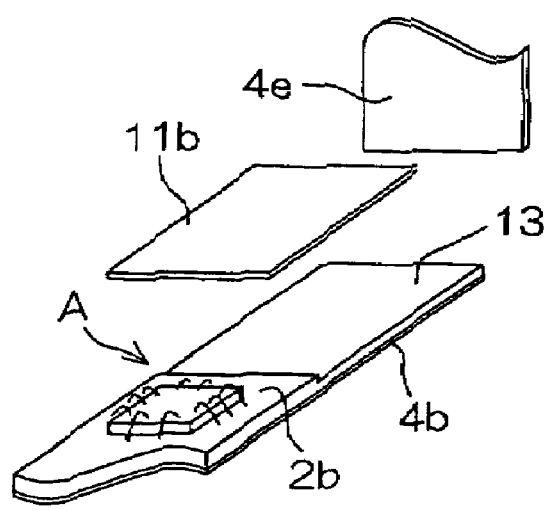

FIG. 3 are exploded side views of the section A. FIG. 3(a) shows an example where an angular U-shaped metal plate 11a is arranged along the edges on the exposed grounding layer 13 of the dielectric substrate 2b. FIG. 3(b) illustrates an example in which a metal plate 11b is arranged to adhere to the whole exposed surface of the grounding layer 13 of the dielectric substrate 2b. In either case, the metal plate 11a or the metal plate 11b is in contact with the surrounding metal plates 4c, 4d and 4e, enabling heat conduction from the metal plates 11a or 11b to the chassis 4.

As shown in FIG. 2, a heatsink 12 may be installed on the metal plate 11b. Such installation can be fixed with locking nuts and bolts or adhesives, for example. This structure allows heat generated from the dielectric substrate 2b to accumulate temporarily in the heatsink 12, effectively curbing temperature fluctuations that may occur in the dielectric substrate 2b.

While representative embodiments of the present invention have been described thus far, the conceivable embodiments are not limited to those herein described, and various modifications are possible. For example, while the chassis 4 consists solely of the metal plates 4a, 4b, 4c, 4d and 4e according to the embodiments herein provided, it is also possible to employ a metal plate only for a part of the chassis.

Figure 4A:
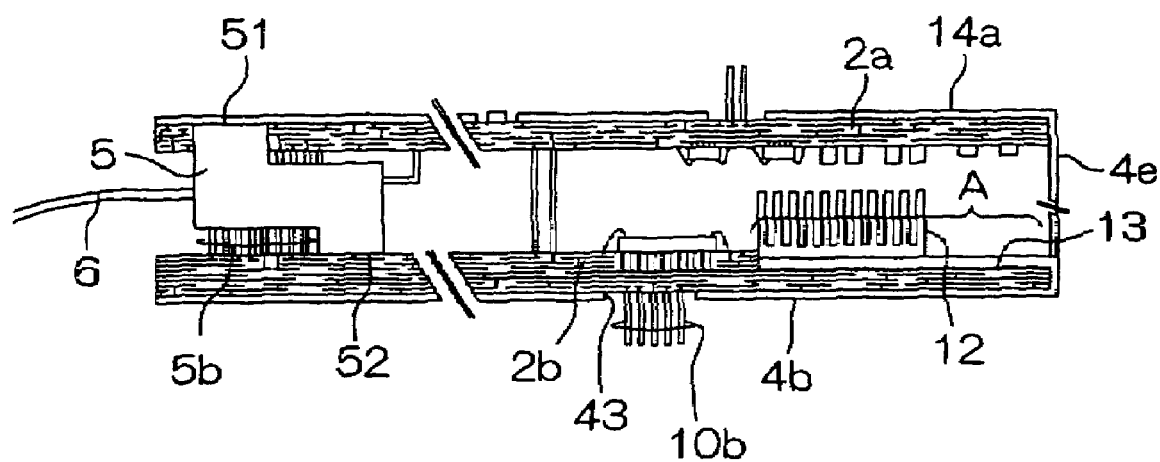
FIG. 4(a) and FIG. 4(b) illustrate a structure of the optical communications module whose chassis consists of resin plates except a part formed from a metal plate.
Figure 4B:
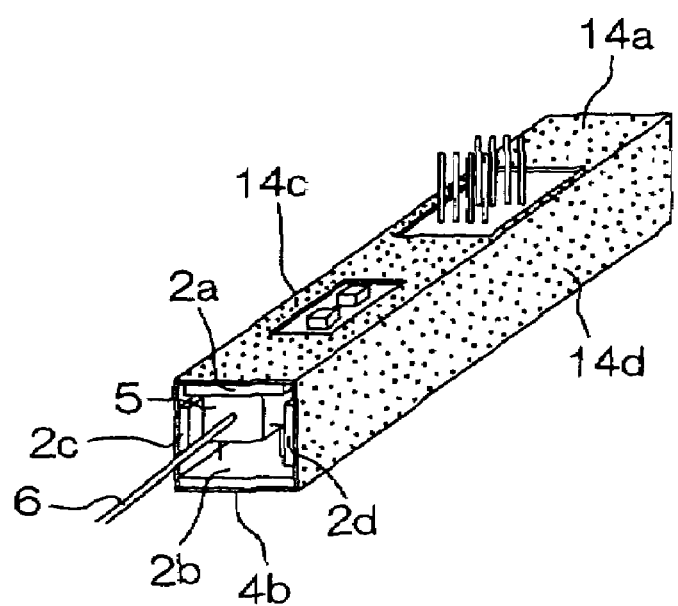

FIG. 4 illustrates the optical communications module 1 employing resin plates 14a, 14c and 14d, instead of the metal plate 4a, 4c and 4d. While FIG. 4(a) is a sectional side view of the optical communications module, FIG. 4(b) gives its perspective view. The resin plates 14a, 14c and 14d have the dielectric substrates 2a, 2c and 2d respectively attached thereto. Differing from these, the dielectric substrate 2b consists of a metal base substrate with a metal plate 4b formed on the rear side. While the dielectric substrates 2a, 2c and 2d are equipped with parts generating relatively low heat, the dielectric substrate 2b has relatively high heat-generating parts mounted thereon.

This structure makes it possible to reduce heat interference that may occur between the dielectric substrates 2a, 2c and 2d, and the dielectric substrate 2b, enabling further improvement in performance of the optical communications module.

In the aforementioned examples, the metal plates 4a, 4b, 4c, 4d and 4e are assembled and adhered together. However, it is also possible to form some metal plates by an integral molding method such that they are combined from the beginning.

FIG. 5(a) is a perspective view of the chassis with a rectangular section, which is formed by assembling two members by fitting one edge of one member into the groove of the other, wherein one member consists of metal plates 4a and 4c formed into a single-piece having an L-shaped section with a groove 15a on the edge thereof, and the other member consists of metal plates 4b and 4d formed into a single-piece having an L-shaped section with a groove 15b on the edge thereof. Interlocking one component with the other in this manner ensures thermal connection among the metal plates 4a, 4b, 4c and 4d.

FIG. 5(b) is a front view of another chassis with a rectangular section, which is formed by fitting two edges of the metal plate 4b into grooves 15c and 15d provided on the edges of a single piece member having an angular U-shaped section consisting of the metal plates 4a, 4c and 4d. Also in this example, interlocking one component with the other in this manner allows thermal connection among the metal plates 4a, 4b, 4c and 4d.

For the embodiments shown in both FIGS. 5(a) and 5(b), it is preferable that processing such as welding, soldering, or adhesive bonding be conducted to fix the metal plates firmly in the grooves.

In addition, various modifications can be made within the scope of the present invention.

What is claimed is:

1. An optical communications module comprising:
a rectangular chassis, said chassis being configured as a casing with a metal surface, wherein at least two of four longest side faces of the chassis are respectively defined by a dielectric wiring substrate having a metal part on an outer side thereof and wherein the metal parts are fixed to one another,
said dielectric wiring substrates having an optical transmitter section, an optical receiver section, or an optical transceiver section provided thereon.

2. An optical communications module according to claim 1, wherein said at least one dielectric wiring substrate having the metal part formed on one side thereof comprises a metal base substrate.

3. An optical communications module according to claim 1, wherein said dielectric wiring substrates are thermally connected together through a metal part of said chassis.

4. An optical communications module according to claim 1, wherein said dielectric wiring substrates are thermally separated from each other.

5. An optical communications module according to claim 1, wherein said chassis has one or more vents.

6. An optical communications module according to claim 1, wherein said one or more dielectric wiring substrates comprise multilayer wiring substrates and an exposed surface of a grounding layer thereof has a metal plate adhered thereto, said metal plate being in thermal contact with the metal part of the chassis.

7. An optical communications module according to claim 1, wherein said dielectric wiring substrates comprise multilayer wiring substrates, and an grounding layer thereof has a heatsink provided on its exposed surface.

8. An optical communications module according to claim 1, wherein the metal part formed on one side of said one or more dielectric wiring substrates is partially removed, exposing terminals or other components of said optical transmitter section, optical receiver section, or optical transceiver section, through the removed portion to the outside of the optical communications module.

* * * * *